(12) United States Patent
Kamata et al.

(10) Patent No.: US 10,755,791 B2
(45) Date of Patent: Aug. 25, 2020

(54) SEMICONDUCTOR STORAGE DEVICE

(71) Applicant: Toshiba Memory Corporation, Minato-ku (JP)

(72) Inventors: Yoshihiko Kamata, Yokohama (JP); Takuyo Kodama, Sagamihara (JP); Yuki Ishizaki, Yokohama (JP); Yoko Deguchi, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/291,337

(22) Filed: Mar. 4, 2019

(65) Prior Publication Data

US 2020/0098435 A1     Mar. 26, 2020

(30) Foreign Application Priority Data

Sep. 20, 2018 (JP) ................................ 2018-176008

(51) Int. Cl.
| | |
|---|---|
| *G11C 16/26* | (2006.01) |
| *G11C 16/34* | (2006.01) |
| *G11C 16/04* | (2006.01) |
| *G11C 16/10* | (2006.01) |
| *G11C 11/56* | (2006.01) |

(52) U.S. Cl.
CPC .......... *G11C 16/26* (2013.01); *G11C 16/0483* (2013.01); *G11C 16/10* (2013.01); *G11C 16/3459* (2013.01); *G11C 11/5642* (2013.01); *G11C 11/5671* (2013.01); *G11C 2211/5621* (2013.01)

(58) Field of Classification Search
CPC .. G11C 16/26; G11C 16/3459; G11C 11/5642
USPC ...................................................... 365/185.22
See application file for complete search history.

(56) References Cited

U.S. PATENT DOCUMENTS

| | | | |
|---|---|---|---|
| 9,047,971 B2 | 6/2015 | Mokhlesi et al. | |
| 9,767,908 B2 | 9/2017 | Bushnaq et al. | |
| 9,922,717 B1 | 3/2018 | Maejima | |
| 2013/0155773 A1* | 6/2013 | Miyamoto | G11C 16/06 365/185.12 |
| 2015/0071005 A1 | 3/2015 | Maejima et al. | |
| 2017/0069394 A1* | 3/2017 | Maejima | G11C 16/26 |

FOREIGN PATENT DOCUMENTS

| | | |
|---|---|---|
| JP | 5075992 | 11/2012 |
| JP | 5911834 | 4/2016 |
| JP | 2018-045749 | 3/2018 |
| JP | 6309909 | 4/2018 |

* cited by examiner

*Primary Examiner* — Anthan Tran
(74) *Attorney, Agent, or Firm* — Oblon, McClelland, Maier & Neustadt, L.L.P.

(57) ABSTRACT

According to an embodiment, a semiconductor storage device includes a first memory cell and a control circuit. The first memory cell is configured to store first data. The control circuit is configured to apply a first voltage to a source of the first memory cell in a read operation of the first data in the first memory cell, and to apply a second voltage to the source of the first memory cell in a verify operation of the first data in the first memory cell. The second voltage is lower than the first voltage.

18 Claims, 8 Drawing Sheets

| | Vg | Vs | Vgs |
|---|---|---|---|
| Pvfy | 2.8V | 1.1V | 1.7V |
| Read | 2.1V | 1.1V | 1.0V |

↑ Vg VOLTAGE DIFFERENCE: 0.7V

F I G. 5A

| | Vg | Vs | Vgs |
|---|---|---|---|
| Pvfy | 2.1V | 0.4V | 1.7V |
| Read | 2.1V | 1.1V | 1.0V |

↑ NO Vg VOLTAGE DIFFERENCE

|  | Vg | Vs | Vgs |
|---|---|---|---|
| Pvfy_wl1 | Vg_i | Vsrc−ΔVi | Vgs_i+ΔVi |
| Read_wl1 | Vg_i | Vsrc | Vgs_i |
| Pvfy_wl2 | Vg_i | (Vsrc−ΔVi)−δVp | (Vgs_i+ΔVi)+δVp |
| Read_wl2 | Vg_i | Vsrc−δVr | Vgs_i+δVr |

F I G. 8

|  | Vg | Vs | Vgs |
|---|---|---|---|
| Pvfy_wl1 | Vg_i | Vsrc−ΔVi | Vgs_i+ΔVi |
| Read_wl1 | Vg_i | Vsrc | Vgs_i |
| Pvfy_wl2 | Vg_i+δVp | Vsrc−ΔVi | (Vgs_i+ΔVi)+δVp |
| Read_wl2 | Vg_i+δVr | Vsrc | Vgs_i+δVr |

F I G. 9

|  | Vg | Vs | Vgs |
|---|---|---|---|
| A_Pvfy | Vg_a | Vsrc−ΔVa | Vgs_a+ΔVa |
| A_Read | Vg_a | Vsrc | Vgs_a |
| B_Pvfy | Vg_b | Vsrc−ΔVb | Vgs_b+ΔVb |
| B_Read | Vg_b | Vsrc | Vgs_b |
| C_Pvfy | Vg_c | Vsrc−ΔVc | Vgs_c+ΔVc |
| C_Read | Vg_c | Vsrc | Vgs_c |

F I G. 10

|  | Vg | Vs | Vgs |
|---|---|---|---|
| A_Pvfy | Vg_a+($\Delta$Va−$\Delta$Vsrc) | Vsrc−$\Delta$Vsrc | Vgs_a+$\Delta$Va |
| A_Read | Vg_a | Vsrc | Vgs_a |
| B_Pvfy | Vg_b+($\Delta$Vb−$\Delta$Vsrc) | Vsrc−$\Delta$Vsrc | Vgs_b+$\Delta$Vb |
| B_Read | Vg_b | Vsrc | Vgs_b |
| C_Pvfy | Vg_c+($\Delta$Vc−$\Delta$Vsrc) | Vsrc−$\Delta$Vsrc | Vgs_c+$\Delta$Vc |
| C_Read | Vg_c | Vsrc | Vgs_c |

F I G. 11

SEMICONDUCTOR STORAGE DEVICE

CROSS-REFERENCE TO RELATED APPLICATIONS

This application is based upon and claims the benefit of priority from prior Japanese Patent Application No. 2018-176008, filed Sep. 20, 2018, the entire contents of which are incorporated herein by reference.

FIELD

Embodiments described herein relate generally to a semiconductor storage device.

BACKGROUND

A NAND-type flash memory is known as a semiconductor storage device.

DETAILED DESCRIPTION

Generally, according to an embodiment, a semiconductor storage device includes a first memory cell and a control circuit. The first memory cell is configured to store first data. The control circuit is configured to apply a first voltage to a source of the first memory cell in a read operation of the first data in the first memory cell, and to apply a second voltage to the source of the first memory cell in a verify operation of the first data in the first memory cell. The second voltage is lower than the first voltage.

Hereinafter, embodiments will be explained with reference to the accompanying drawings. The drawings are schematic. In the explanation that follows, constituent elements having substantially the same functions and configurations will be denoted by the same reference symbols. The numbers after the letters constituting the reference symbols, and the letters after the numbers constituting the reference symbols, are used to discriminate between elements denoted by reference symbols which share common letters or numbers and which have similar configurations. If there is no need to discriminate between the elements denoted by the reference symbols sharing common letters or numbers, such elements are denoted by reference symbols that include only the common letters or numbers.

First Embodiment

Hereinafter, a semiconductor storage device 1 according to a first embodiment will be explained.

Figure 1:
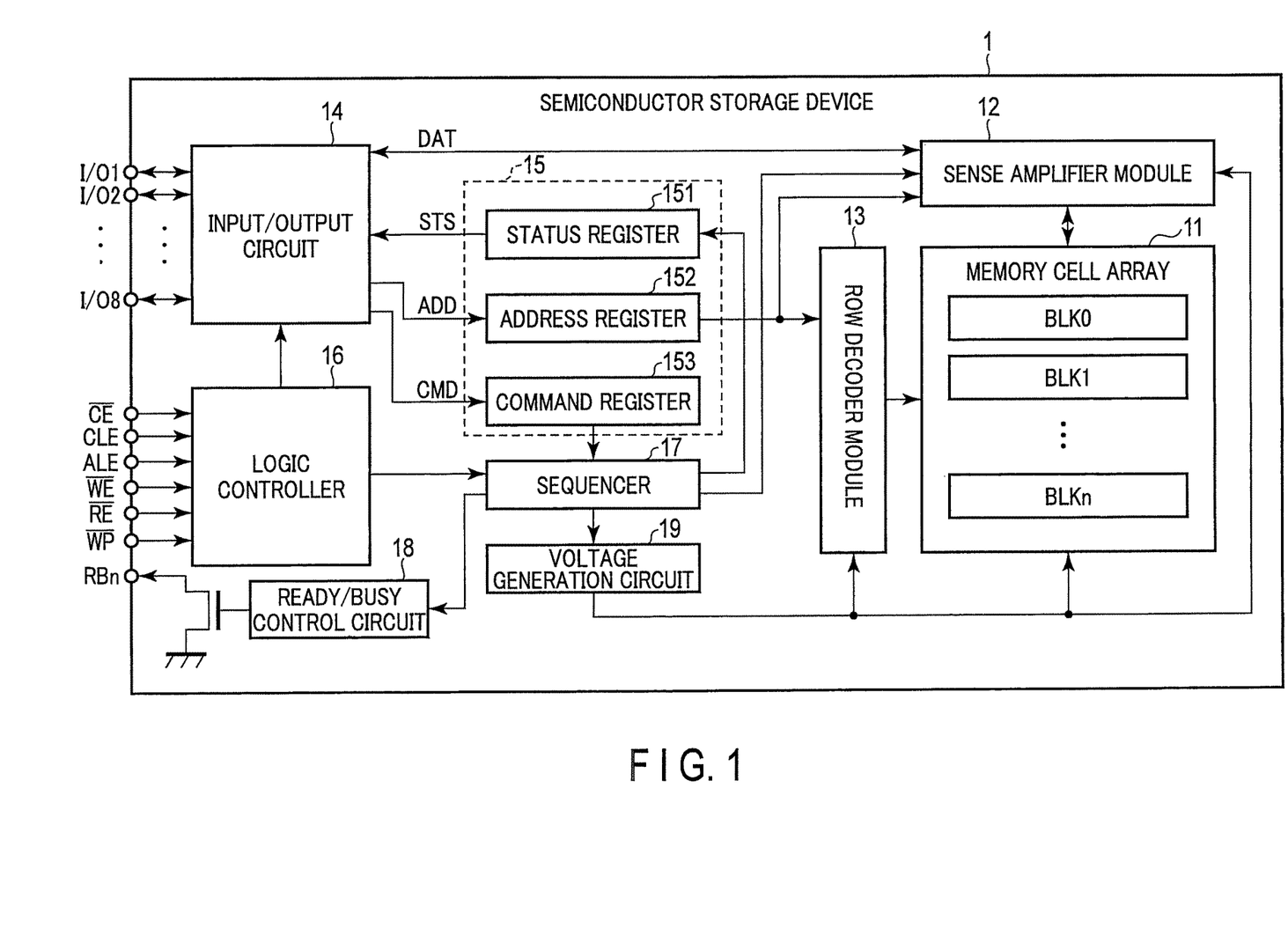
FIG. 1 is a block diagram illustrating an example of an overall configuration of a semiconductor storage device according to a first embodiment.

Configuration Example (1) Overall Configuration of Semiconductor Storage Device FIG. 1 is a block diagram illustrating an example of an overall configuration of a semiconductor storage device 1 according to a first embodiment. The semiconductor storage device 1 according to the first embodiment is, for example, a NAND-type flash memory, which is controlled by an external memory controller and can store data in a non-volatile manner.

As shown in FIG. 1, the semiconductor storage device 1 includes a memory cell array 11, a sense amplifier module 12, a row decoder module 13, an input/output circuit 14, a register 15, a logic controller 16, a sequencer 17, a ready/busy control circuit 18, and a voltage generation circuit 19. In the semiconductor storage device 1, various operations are performed, such as a write operation, to cause write data DAT to be stored in the memory cell array 11, a read operation to read read data DAT from the memory cell array 11, etc.

The memory cell array 11 includes a plurality of blocks BLK0 to BLKn (where "n" is an integer of 1 or greater). Each block BLK includes a plurality of non-volatile memory cells each associated with a bit line and a word line, and constitutes, for example, a unit of data erasure. Either single-level cell (SLC) type or multi-level cell (MLC) type may be adopted as the semiconductor storage device 1. An SLC-type memory cell holds 1-bit data, while an MLC-type memory cell holds 2-bit data.

The sense amplifier module 12 reads data DAT from the memory cell array 11, and outputs the read data DAT to an external memory controller via the input/output circuit 14. The sense amplifier module 12 receives write data DAT from the external memory controller via the input/output circuit 14, and transfers the received write data DAT to the memory cell array 11.

The row decoder module 13 selects a target block BLK to be subject to various operations, such as a read operation and a write operation, on the basis of a block address held in an address register 152 in the register 15. The row decoder module 13 is capable of transferring voltages supplied from the voltage generation circuit 19 to the selected block BLK.

The input/output circuit 14 transmits and receives, for example, input/output signals I/O (I/O1 to I/O8) of 8 bits width, both to and from the external memory controller, for example. The input/output signals I/O include commands CMD, data DAT, address information ADD, status information STS, etc. The data DAT includes write data DAT or read data DAT. The address information ADD includes, for example, a column address, a block address, and a page address. The status information STS includes, for example, information on the status of the semiconductor storage device 1 with respect to a write operation and a read operation.

For example, the input/output circuit 14 receives input/output signals I/O from the memory controller. The input/output circuit 14 transfers write data DAT included in the received input/output signals I/O to the sense amplifier module 12, and transfers address information ADD and commands CMD, included in the received input/output signals I/O, to the register 15. The input/output circuit 14 receives the read data DAT transferred from the sense amplifier module 12, and transmits the received read data DAT to the external memory controller as the input/output signals I/O.

The register 15 includes a status register 151, the address register 152, and a command register 153.

The status register 151 holds status information STS, and transfers the status information STS to the input/output circuit 14 on the basis of an instruction from the sequencer 17. The address register 152 holds address information ADD transferred from the input/output circuit 14. A column address in the address information ADD is used in the sense amplifier module 12, a block address in the address information ADD is used by the row decoder module 13, and a page address in the address information ADD is used by the sequencer 17. The command register 153 holds a command CMD transferred from the input/output circuit 14.

The logic controller 16 receives various control signals from, for example, the external memory controller, and controls the input/output circuit 14 and the sequencer 17 on the basis of the received control signals. Examples of such control signals include a chip enable signal /CE, a command latch enable signal CLE, an address latch enable signal ALE, a write enable signal /WE, a read enable signal /RE, and a write protect signal /WP.

The chip enable signal /CE is a signal used to enable the semiconductor storage device 1. The command latch enable signal CLE is a signal used to notify the input/output circuit 14 that a signal input to the semiconductor storage device 1 serves as a command CMD. The address latch enable signal ALE is a signal used to notify the input/output circuit 14 that a signal input to the semiconductor storage device 1 serves as address information ADD. The write enable signal /WE and the read enable signal /RE are signals used to instruct the input/output circuit 14 to respectively input and output input/output signals I/O, for example. The write protect signal /WP is a signal used to instruct the semiconductor storage device 1 to prohibit data writing and erasing.

The sequencer 17 controls the operation of the entire semiconductor storage device 1 on the basis of a command CMD held in the command register 153. As an example, the sequencer 17 controls, for example, the sense amplifier module 12, the row decoder module 13, and the voltage generation circuit 19, and performs various operations such as a write operation and a read operation.

The ready/busy control circuit 18 is capable of generating a ready/busy signal RBn on the basis of the operation state of the sequencer 17. The ready/busy signal RBn is a signal used to notify the memory controller of whether the semiconductor storage device 1 is in a "ready" state in which the semiconductor storage device 1 is ready to receive an instruction from the memory controller, or in a "busy" state in which the semiconductor storage device 1 is not ready to receive an instruction.

The voltage generation circuit 19 generates various voltages on the basis of the control by the sequencer 17, and supplies the generated voltages to the memory cell array 11, the sense amplifier module 12, the row decoder module 13, etc. For example, the voltage generation circuit 19 generates voltages to be applied to word lines WL and a source line SL (which will be described later) during operations such as a read operation and a write operation. The voltage generation circuit 19 supplies, to the row decoder module 13, the generated voltages to be applied to the word lines WL, and supplies, to the source line SL in the memory cell array 11, the generated voltage to be applied to the source line SL.

(2) Memory Cell Array of NAND-Type Flash Memory

Figure 2:
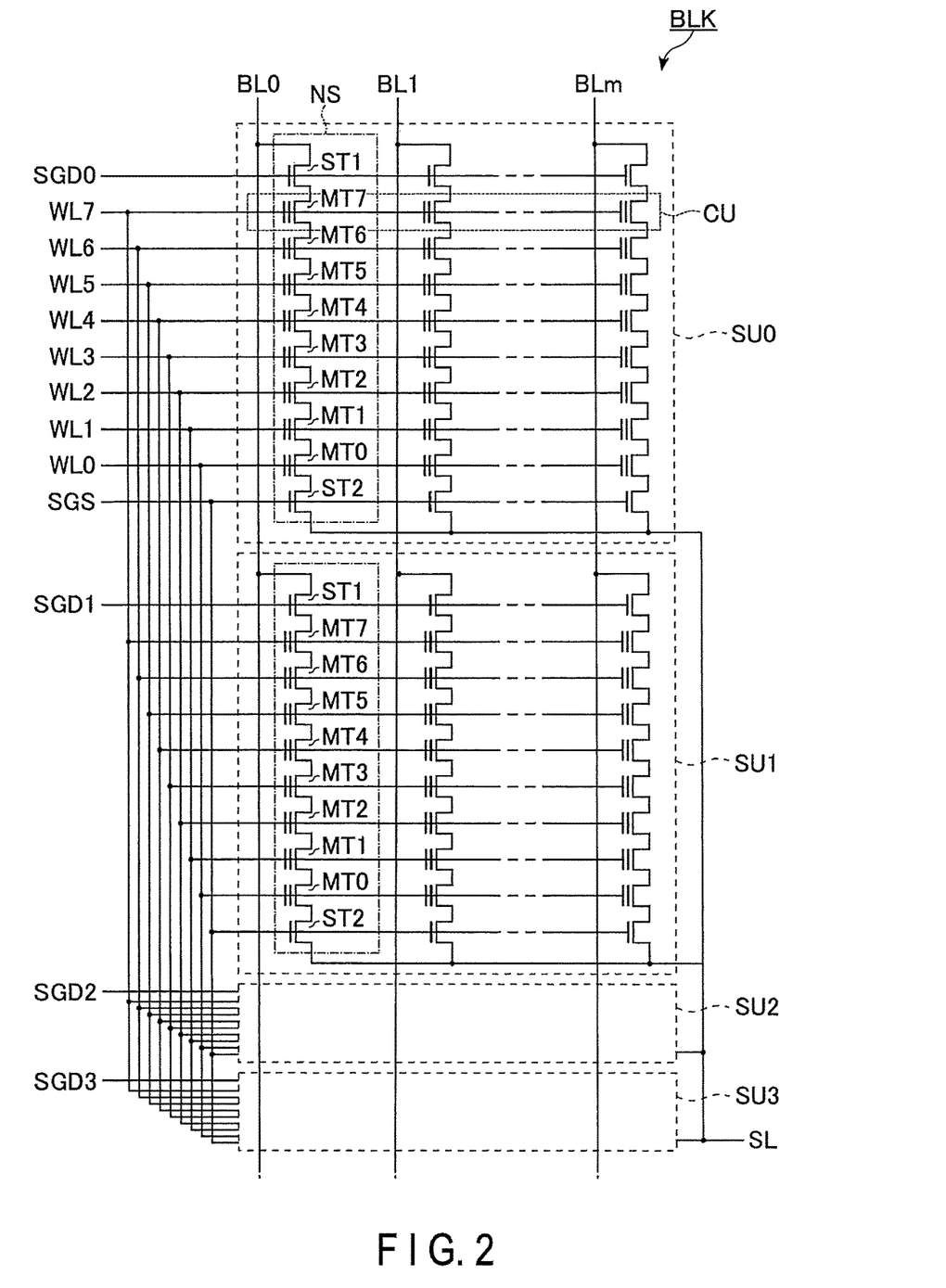
FIG. 2 is a diagram illustrating an example of a circuit configuration of a memory cell array in the semiconductor storage device according to the first embodiment.

FIG. 2 is a diagram illustrating an example of a circuit configuration of one of a plurality of blocks BLK included in the memory cell array 11, as an example of a circuit configuration of the memory cell array 11 shown in FIG. 1.

As shown in FIG. 2, a block BLK includes, for example, four string units SU0 to SU3. Each of the string units SU includes a plurality of NAND strings NS. Each of the NAND strings NS is associated with a corresponding bit line BL of a plurality of bit lines BL0 to BLm (where "m" is an integer of 1 or greater), and includes, for example, memory cell transistors MT0 to MT7 and select transistors ST1 and ST2. Each of the memory cell transistors MT includes a control gate and a charge accumulation layer, and stores data in a non-volatile manner. The select transistors ST1 and ST2 are used to select a NAND string NS including the select transistors ST1 and ST2 during various operations.

A drain of the select transistor ST1 of each of the NAND strings NS is coupled to the corresponding bit line BL. The memory cell transistors MT0 to MT7 are coupled in series between a source of the select transistor ST1 and a drain of the select transistor ST2. A source of the select transistor ST2 is coupled to the source line SL.

The control gates of the memory cell transistors MT0 to MT7 included in the respective NAND strings NS of the same block BLK are coupled in common to a corresponding word line WL of the word lines WL0 to WL7. The gates (control gates) of the select transistors ST1 of the respective NAND strings NS included in each of the string units SU0 to SU3 are coupled in common to one of the select gate lines SGD0 to SGD3 corresponding to the string unit SU. The gates of the select transistors ST2 of the respective NAND strings NS included in the same block BLK are coupled in common to a select gate line SGS.

A bit line BL is coupled to drains of the select transistors ST1 of corresponding NAND strings NS of a plurality of string units SU in common. The source line SL is shared by a plurality of string units SU.

A group of memory cell transistors MT coupled to a common word line WL in a string unit SU is referred to as, for example, a cell unit CU. When, for example, each of a plurality of memory cell transistors MT in a cell unit CU holds 1-bit data, data equivalent to the storage capacity of the cell unit CU is referred to as, for example, "1-page data".

The circuit configuration of the memory cell array 11 has been explained as above; however, the circuit configuration of the memory cell array 11 is not limited thereto. For example, the number of string units SU included in each block BLK may be designed to be any number. Also, the number of the memory cell transistors MT and the select transistors ST1 and ST2 included in each NAND string NS may be designed to be any number. The number of word lines WL and the number of select gate lines SGD and SGS may be changed on the basis of the number of memory cell transistors MT and the number of select transistors ST1 and ST2.

(3) Sense Amplifier Module

Figure 3:
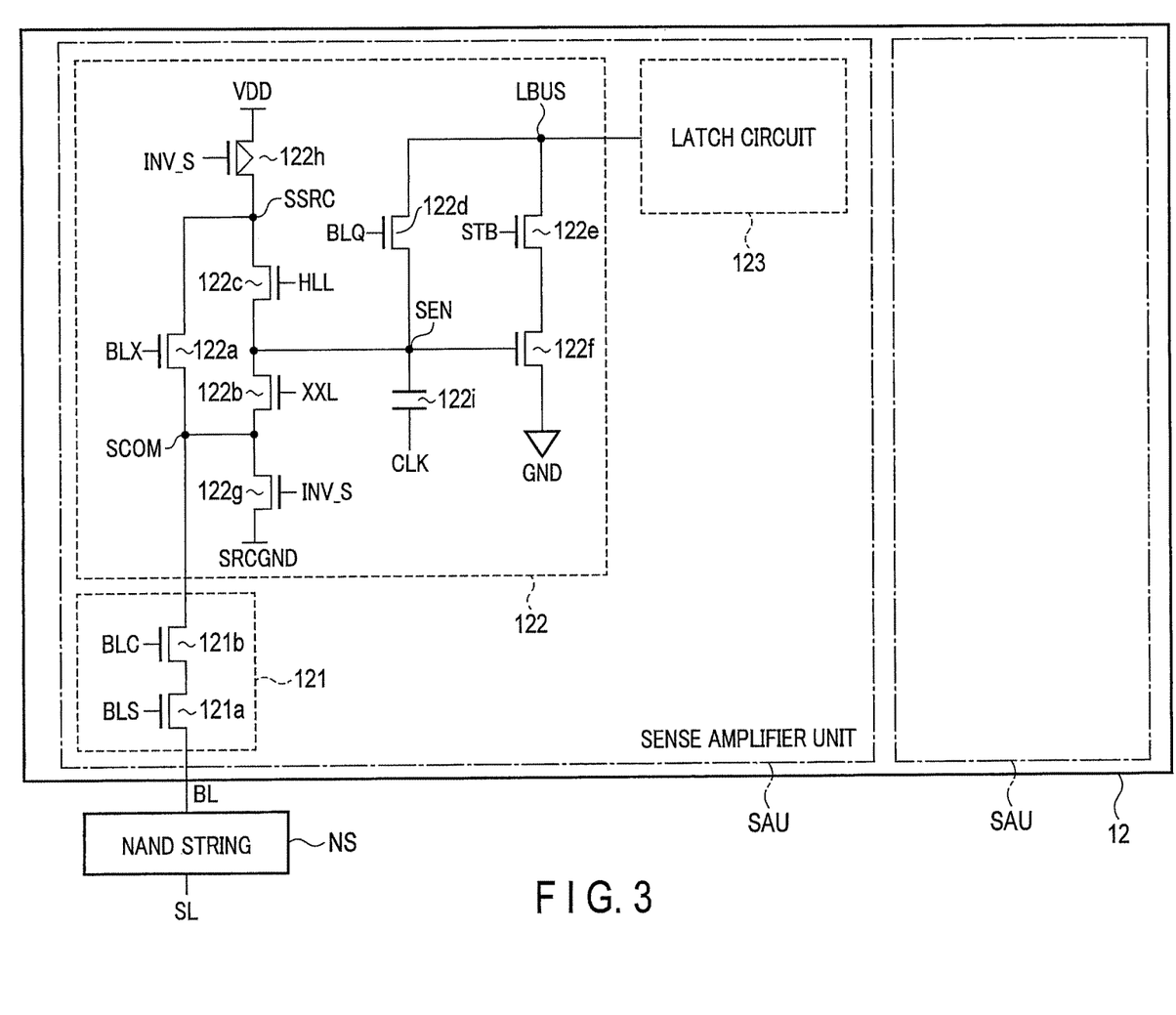
FIG. 3 is a diagram illustrating an example of a circuit configuration of a sense amplifier module in the semiconductor storage device according to the first embodiment.

FIG. 3 is a diagram illustrating an example of a circuit configuration of the sense amplifier module 12 shown in FIG. 1. In the explanation that follows, a memory cell transistor MT as a write target or read target will be referred to as a select memory cell transistor MT.

The sense amplifier module 12 includes a plurality of sense amplifier units SAU provided for, for example, the respective bit lines. As shown in FIG. 3, each of the sense amplifier units SAU includes a coupling section 121, a sensing section 122, and a latch circuit 123. For example, when each of the memory cell transistors holds data of two or more bits, two or more latch circuits are provided on the basis of the number of bits of the data.

The coupling section 121 couples a corresponding bit line BL with the sensing section 122. Specifically, the coupling section 121 includes n-channel MOS transistors 121a and 121b. A first terminal of the transistor 121a is coupled to the corresponding bit line BL, and a second terminal of the transistor 121a is coupled to a first terminal of the transistor 121b. A control signal BLS is applied to a gate of the transistor 121a. A second terminal of the transistor 121b is coupled to a node SCOM, and a control signal BLC is applied to a gate of the transistor 121b. The transistor 121b enables the corresponding bit line BL to be clamped at a potential determined according to the control signal BLC.

The sensing section 122 senses read data on the basis of the potential of the bit line BL.

The sensing section 122 includes an n-channel MOS transistor 122a, . . . , and an n-channel MOS transistor 122g, a p-channel MOS transistor 122h, and a capacitive element 122i.

A first terminal of the transistor 122a is coupled to the node SCOM, and a second terminal of the transistor 122a is coupled to a node SSRC. A control signal BLX is applied to a gate of the transistor 122a. A first terminal of the transistor 122h is coupled to the node SSRC, and a second terminal of the transistor 122h is coupled to a power-supply node VDD. A gate of the transistor 122h is coupled to a node INV_S. A first terminal of the transistor 122c is coupled to the node SSRC, and a second terminal of the transistor 122c is coupled to a node SEN. A control signal HLL is applied to a gate of the transistor 122c. A first electrode of the capacitive element 122i is coupled to the node SEN, and a signal CLK is supplied to a second electrode of the capacitive element 122i. A first terminal of the transistor 122b is coupled to the node SEN, and a second terminal of the transistor 122b is coupled to the node SCOM. A control signal XXL is applied to a gate of the transistor 122b. A first terminal of the transistor 122g is coupled to the node SCOM, a second terminal of the transistor 122g is coupled to a node SRCGND, and a gate of the transistor 122g is coupled to the node INV_S. A voltage applied to the node SRCGND is, for example, VSS. VSS represents, for example, 0 V.

The transistor 122h and the transistor 122a enable the bit line BL to be pre-charged. The transistor 122h and the transistor 122c enable the capacitive element 122i to be charged. The transistor 122b enables the node SEN to be discharged in data sensing. The transistor 122g enables the bit line BL to be fixed at a predetermined potential.

A first terminal of the transistor 122d is coupled to the node SEN, and a second terminal of the transistor 122d is coupled to a node LBUS. A control signal BLQ is applied to a gate of the transistor 122d. The node LBUS is a signal path that couples the sensing section 122 and the latch circuit 123. A first terminal of the transistor 122e is coupled to the node LBUS, and a second terminal of the transistor 122e is coupled to a first terminal of the transistor 122f. A control signal STB is applied to a gate of the transistor 122e. A second terminal of the transistor 122f is grounded, and a gate of the transistor 122f is coupled to the node SEN.

The transistor 122e enables the data sense timing to be determined, and allows the read data to be stored into the latch circuit 123. The transistor 122f makes it possible to sense whether the read data is "0" or "1", on the basis of the potential of the node SEN.

The node INV_S is a node in the latch circuit 123, and may assume a logic level according to the data stored in the latch circuit 123. For example, when the select memory cell transistor MT is turned on during a data read operation, and the potential of the node SEN is sufficiently reduced, the node INV_S assumes level H. On the other hand, when the select memory cell transistor MT is OFF, and the potential of the node SEN is kept at a predetermined potential, the node INV_S has level L.

In the above-described configuration, the read data based on the potential of the node SEN is transferred to the latch circuit 123 through the transistor 122e at the timing when the control signal STB is asserted. The control signals STB, BLS, BLC, BLX, HLL, XXL, and BLQ are supplied by, for example, the sequencer 17.

The configuration of the sense amplifier module 12 explained in detail above is merely an example, and various configurations may be adopted as the sense amplifier module 12.

(4) Threshold Voltage Distributions of Memory Cell Transistors

Figure 4:
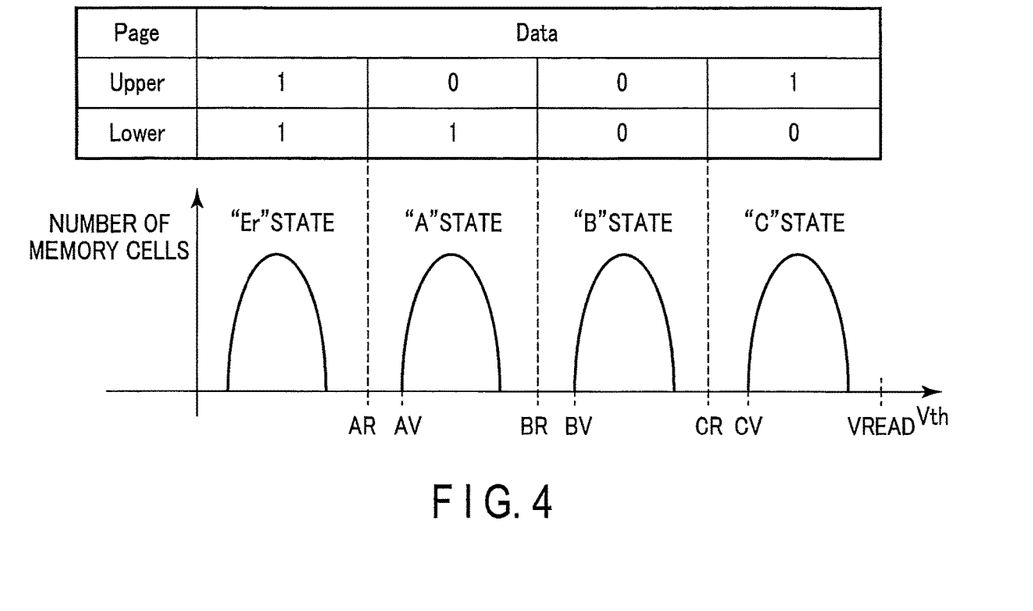
FIG. 4 is a diagram illustrating an example of threshold voltage distributions formed by memory cell transistors of the semiconductor storage device according to the first embodiment.

FIG. 4 is a diagram illustrating an example of threshold voltage distributions, data allocation, read voltages, and verify voltages of the case where memory cell transistors MT in the memory cell array 11 shown in FIG. 1 each hold 2-bit data.

A memory cell transistor MT holds 2-bit data on the basis of a gate-source potential difference that enables the memory cell transistor MT to be turned on (hereinafter referred to as a "threshold voltage"). In the above-described write operation, the threshold voltages of memory cell transistors MT are controlled. FIG. 4 illustrates four threshold voltage distributions formed as a result of such control of the threshold voltages. In the threshold voltage distributions shown in FIG. 4, the vertical axis represents the number of memory cell transistors MT, and the horizontal axis represents threshold voltages Vth of the memory cell transistors MT. As an example, the horizontal axis indicates voltages to be applied to a gate of a memory cell transistor MT to turn on the memory cell transistor MT when a voltage VSRC is applied to a source of the memory cell transistor MT.

For example, the four threshold voltage distributions are distinguished from each other as corresponding to "Er" state, "A" state, "B" state, and "C" state in the order of the lower to higher threshold voltage distributions. For example, data "11" (which corresponds to the lower bit and the upper bit respectively) is assigned to Er state, data "10" is assigned to A state, data "00" is assigned to B state, and data "01" is assigned to C state. The data assigned to each state of threshold voltage distribution is the data stored in a memory cell transistor MT, having a threshold voltage included in the threshold voltage distribution.

A verify voltage used in a write operation is set between neighboring threshold voltage distributions. Specifically, a verify voltage AV is set for A state, a verify voltage BV is set for B state, and a verify voltage CV is set for C state. A verify voltage is a voltage used in a verify operation to confirm whether or not the threshold voltage of a memory cell transistor MT has reached the target state.

More specifically, the verify voltage AV is set between the maximum threshold voltage in the threshold voltage distribution of Er state and the minimum threshold voltage in the threshold voltage distribution of A state. When the verify voltage AV is applied to memory cell transistors MT, a memory cell transistor MT having a threshold voltage included in the threshold voltage distribution of Er state is turned on, while a memory cell transistor MT having a threshold voltage included in the threshold voltage distribution of A state or above is OFF. It is thereby possible to confirm, as a result of a write operation of the data "10", for example, whether or not the threshold voltage of a memory cell transistor MT is included in the threshold voltage distribution of A state.

The other verify voltages BV and CV are set in a manner similar to the setting of the verify voltage AV. The verify voltage BV is set between the maximum threshold voltage in the threshold voltage distribution of A state and the minimum threshold voltage in the threshold voltage distribution of B state; and the verify voltage CV is set between the maximum threshold voltage in the threshold voltage distribution of B state and the minimum threshold voltage in the threshold voltage distribution of C state.

Also, a read voltage used in a read operation is set between neighboring threshold voltage distributions. Specifically, a read voltage AR is set for A state, a read voltage BR is set for B state, and a read voltage CR is set for C state. A read voltage is a voltage used in a read operation to confirm which threshold voltage distribution the threshold voltage of the memory cell transistor MT is included in.

More specifically, the read voltage AR is set between the maximum threshold voltage in the threshold voltage distribution of Er state and the minimum threshold voltage in the threshold voltage distribution of A state, as in the verify voltage AV. When the read voltage AR is applied to memory cell transistors MT, a memory cell transistor MT having a threshold voltage included in the threshold voltage distribution of Er state is turned on, while a memory cell transistor MT having a threshold voltage included in the threshold voltage distribution of A state or above is OFF. It is thereby possible to determine whether the threshold voltage of a memory cell transistor MT is included in the threshold voltage distribution of Er state or in the threshold voltage distribution of A state or above.

The other read voltages BR and CR are set in a manner similar to the setting of the read voltage AR. The read voltage BR is set between the maximum threshold voltage in the threshold voltage distribution of A state and the minimum threshold voltage in the threshold voltage distribution of B state, and the read voltage CR is set between the maximum threshold voltage in the threshold voltage distribution of B state and the minimum threshold voltage in the threshold voltage distribution of C state.

The above-described verify voltages and read voltages have the following magnitude relationship. That is, the verify voltage AV is set to be higher than the read voltage AR, the verify voltage BV is set to be higher than the read voltage BR, and the verify voltage CV is set to be higher than the read voltage CR. For example, the verify voltage AV is set in the proximity of the tail of the threshold voltage distribution of A state, the verify voltage BV is set in the proximity of the tail of the threshold voltage distribution of B state, and the verify voltage CV is set in the proximity of the tail of the threshold voltage distribution of C state.

Furthermore, a read pass voltage VREAD is set to be higher than the maximum threshold voltage of the highest threshold voltage distribution. When the read pass voltage VREAD is applied to a gate of a memory cell transistor MT, the memory cell transistor MT is turned on, regardless of the data stored therein.

The bit count of data stored in a memory cell transistor MT and the data allocation for the threshold voltage distributions described above are merely an example, and are not limited thereto. For example, data of one bit or three or more bits may be held in a memory cell transistor MT.

Operation Example (1) Outline of Write Operation and Read Operation

The semiconductor storage device 1 according to the first embodiment iteratively executes a program loop in a write operation. The program loop includes a program operation and a verify operation. The program operation is an operation to inject electrons into a charge accumulation layer in a select memory cell transistor MT, thereby increasing the threshold voltage of the select memory cell transistor MT (or to inhibit injection of electrons into the charge accumulation layer, thereby maintaining the threshold voltage of the select memory cell transistor MT). The verify operation is an operation to confirm whether or not the threshold voltage of the select memory cell transistor MT has reached a target state, by performing a read operation using a verify voltage, subsequent to the program operation.

If the threshold voltage of a select memory cell transistor MT has reached the target state, the write operation to the select memory cell transistor MT is prohibited thereafter.

By iteratively executing the program loop, the threshold voltage of the select memory cell transistor MT is increased to the target state.

The electrons accumulated in the charge accumulation layer may be in an unstable state. Thus, electrons accumulated in the charge accumulation layer of the memory cell transistor MT may be detached from the charge accumulation layer with the passage of time, from when the program operation has ended. When electrons are detached from the charge accumulation layer, the threshold voltage of the memory cell transistor MT decreases. Thus, a read operation after completion of the write operation is performed using a read voltage lower than the verify voltage, to address the decrease in the threshold voltage of the memory cell transistor that may occur with the passage of time.

(2) Examples of Voltages Used in Verify Operation and Read Operation

Figure 5A:
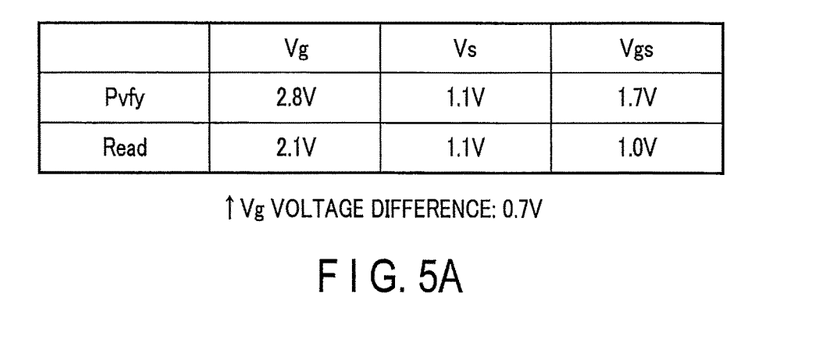
FIG. 5A is a table illustrating an example of voltages used in a verify operation and a read operation in a semiconductor storage device according to a comparative example of the first embodiment.
Figure 5B:
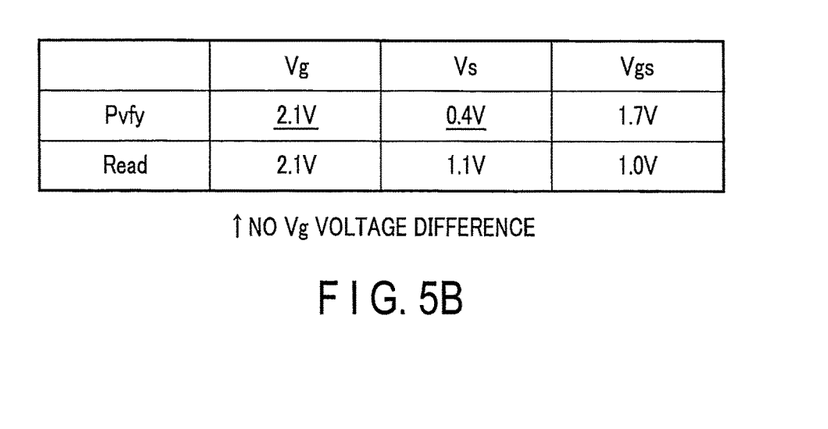
FIG. 5B is a table illustrating an example of voltages used in a verify operation and a read operation in the semiconductor storage device according to the first embodiment.

FIG. 5A is a table illustrating an example of voltages used in a verify operation and a read operation in a semiconductor storage device according to a comparative example of the first embodiment; and FIG. 5B is a table illustrating an example of voltages used in a verify operation and a read operation in the semiconductor storage device 1 according to the first embodiment.

FIGS. 5A and 5B illustrate examples in which a verify operation and a read operation of data corresponding to one of the states of threshold voltage distributions shown in FIG. 4, for example, are performed on a select memory cell transistor MT. In FIGS. 5A and 5B, a voltage Vg to be applied to a gate of the select memory cell transistor MT, a voltage. Vs to be applied to a source of the select memory cell transistor MT, and the potential difference Vgs provided between the gate and the source of the select memory cell transistor MT are illustrated. The voltage Vs to be applied to the source is a voltage to be applied to the source line SL. Settings similar to the settings of voltages that will be explained below may be applied to data corresponding to any state.

Vgs corresponds to the verify voltage and the read voltage. In both of FIGS. 5A and 5B, Vgs in the verify operation is 1.7 V, and Vgs in the read operation is 1.0 V. As explained with reference to FIG. 4, Vgs in the verify operation is larger than Vgs in the read operation, with the difference being, for example, 0.7 V.

In FIG. 5A, Vg in the read operation is set to 2.1 V, and Vg in the verify operation is set to 2.8 V, while Vs is set to the same voltage of 1.1 V in both the verify operation and the read operation. At this time, Vg in the verify operation is higher than Vg in the read operation by 0.7 V. This 0.7 V corresponds to the above-described difference of 0.7 V between Vgs in the verify operation and Vgs in the read operation. Thus, in FIG. 5A, Vg in the verify operation is set to be higher than Vg in the read operation by an amount by which Vgs in the verify operation is larger than Vgs in the read operation. Thereby, a difference can be provided between Vgs in the verify operation and Vgs in the read operation.

In FIG. 5B, Vs in the read operation is set to 1.1 V, which is the same as in the case of FIG. 5A, and Vs in the verify operation is set to 0.4 V. On the other hand, Vg is set to the same voltage of 2.1 V in both the verify operation and the read operation. At this time, Vs in the verify operation is lower than Vs in the read operation by 0.7 V. This 0.7 V corresponds to the above-described difference of 0.7 V between Vgs in the verify operation and Vgs in the read operation. Thus, in FIG. 5B, Vs in the verify operation is set to be lower than Vs in the read operation by an amount by which Vgs in the verify operation is larger than Vgs in the read operation. Thereby, a difference can be provided between Vgs in the verify operation and Vgs in the read operation. At this time, Vg in the verify operation may be set to be equal to Vg in the read operation, as shown in FIG. 5B.

The control of voltages according to the present embodiment is not limited to the above-described one. For example, by setting Vs in the verify operation lower than Vs in the read operation, Vg in the verify operation can be set at a low level, compared to when such a setting is not adopted. It is not necessarily required that Vg in the verify operation is set to be equal to Vg in the read operation, as described above.

The above-described operation will be explained along the time course, with reference to the timing charts.

Figure 6A:
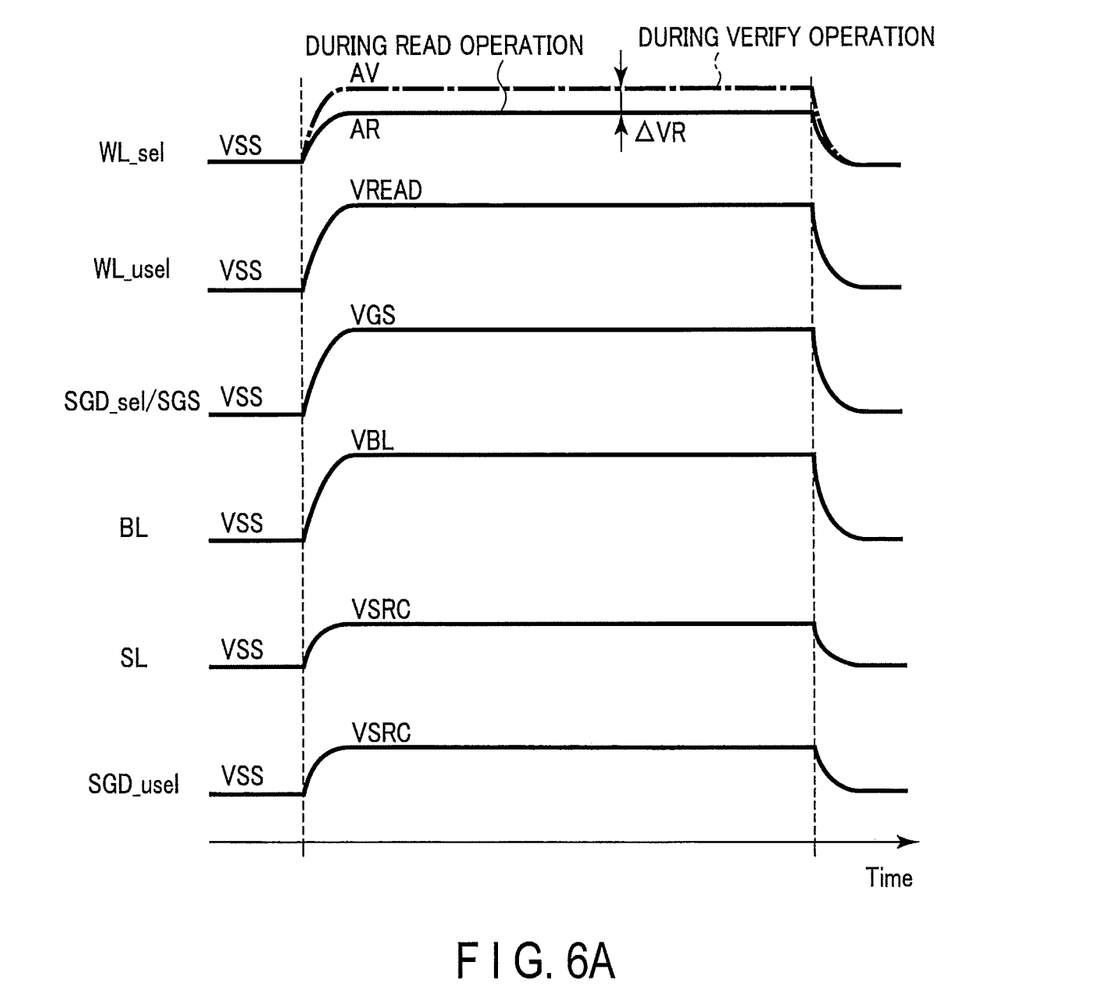
FIG. 6A is a timing chart illustrating an example of temporal changes in voltages applied to respective signal lines during operations of the semiconductor storage device according to the comparative example of the first embodiment.
Figure 6B:
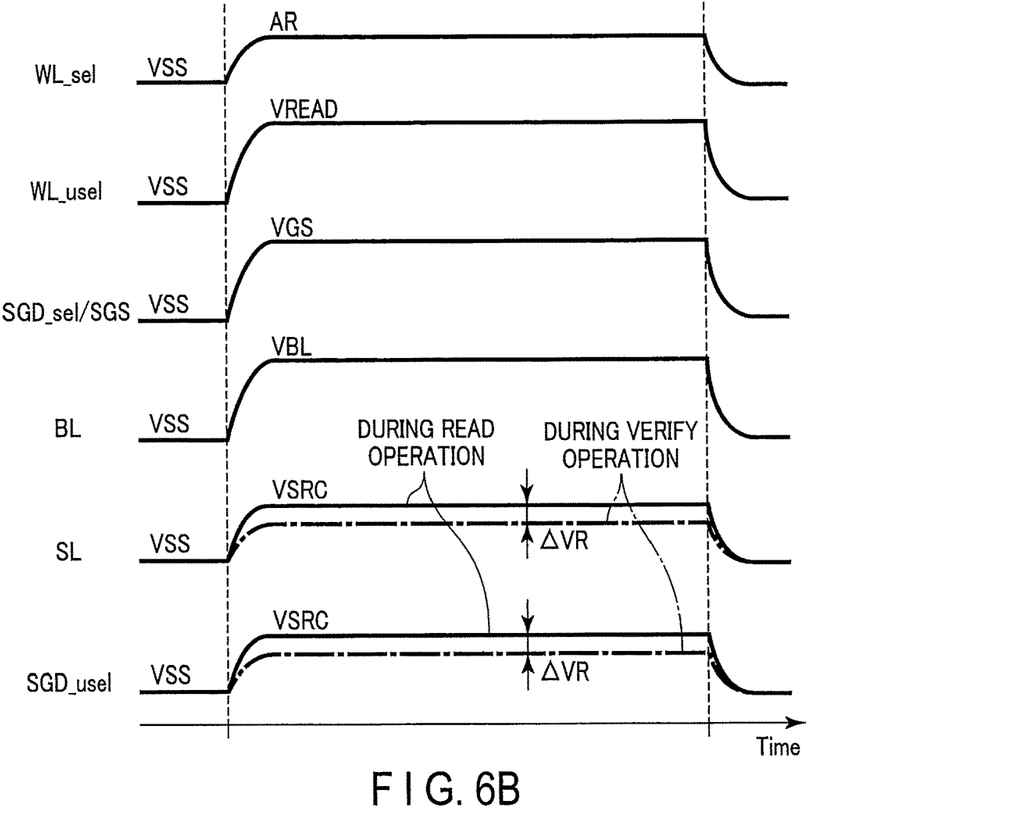
FIG. 6B is a timing chart illustrating an example of temporal changes in voltages applied to the respective signal lines during operations of the semiconductor storage device according to the first embodiment.

FIG. 6A is a timing chart illustrating an example of temporal changes in voltages applied to respective signal lines during operations of the semiconductor storage device according to the comparative example of the first embodiment, and corresponds to the case of FIG. 5A. FIG. 6B is a timing chart illustrating an example of temporal changes in voltages applied to the respective signal lines during operations of the semiconductor storage device 1 according to the first embodiment, and corresponds to the case of FIG. 5B. FIGS. 6A and 6B illustrate examples in which a verify operation and a read operation of data corresponding to A state are performed.

In FIGS. 6A and 6B, the selected word line is indicated as WL_sel, non-selected word lines are indicated as WL_usel, the select gate line selected from the select gate lines SGD is indicated as SGD_sel, and non-selected select gate lines are indicated as SGD_usel, for convenience in illustration. Here, the word line WL_sel is a word line WL coupled to a select memory cell transistor MT, and the select gate line SGD_sel is a select gate line SGD of the selected string unit SU. The voltage to be applied to the word line WL_sel and the voltage to be applied to the source line SL in FIGS. 6A and 6B correspond to Vg and Vs, respectively.

In the examples shown in FIGS. 6A and 6B, the voltages of the word lines WL_sel and WL_usel, the select gate lines SGD_sel, SGD_usel, and SGS, the bit line BL, and the source line SL are VSS at the start of a verify operation and a read operation.

In the example shown in FIG. 6A, to perform a verify operation and a read operation, the signal lines are controlled in a manner that will be described below.

The sense amplifier module 12 charges the bit line BL, and a voltage VBL is applied to the bit line BL.

The sequencer 17 controls the voltage generation circuit 19, applies a voltage VSRC to the source line SL and the select gate lines SGD_usel, and applies a voltage VGS to the select gate lines SGD_sel and SGS.

The row decoder module 13 transfers a voltage VREAD to the word lines WL_usel. The row decoder module 13 transfers, to the word line WL_sel, a voltage AV in the verify operation, and a voltage AR in the read operation. As shown in FIG. 6A, the voltage AV is higher than the voltage AR by ΔVR.

The sense amplifier module 12 can determine whether or not the select memory cell transistor MT is turned on by the gate-source potential difference of the select memory cell transistor MT provided in this manner. Thereby, in the verify operation, the sense amplifier module 12 can determine whether or not the threshold voltage of the select memory cell transistor MT has reached the threshold voltage distribution of A state. In the read operation, the sense amplifier module 12 can determine whether or not the threshold voltage of the select memory cell transistor MT is included in the threshold voltage distribution of Er state or the threshold voltage distribution of A state or above.

In the example shown in FIG. 6B, to perform a verify operation and a read operation, the signal lines are controlled in a manner that will be described below.

The control of the bit line EL, the word lines WL_usel, and the select gate lines SGD_sel and SGS is similar to the control explained with reference to FIG. 6A.

The control different from the control explained with reference to FIG. 6A will be explained below.

The sequencer 17 controls the voltage generation circuit 19, and applies, to the source line SL and the select gate lines SGD_usel, a voltage lower than the voltage VSRC by ΔVR in a verify operation, and a voltage VSRC in a read operation.

The row decoder module 13 transfers a voltage AR to the word line WL_sel.

By thus controlling the voltages of the signal lines, the gate-source potential difference Vgs of the select memory cell transistor MT in the verify operation will be the same as the example shown in FIG. 6A. Similarly, the gate-source potential difference Vgs of the select memory cell transistor MT in the read operation will be the same as the potential difference of the example shown in FIG. 6A. Accordingly, the sense amplifier module 12 is capable of performing determination similar to the case of FIG. 6A in both the verify operation and the read operation.

ADVANTAGEOUS EFFECTS

The gate-source potential difference provided in a select memory cell transistor MT in each of a verify operation and a read operation of first data is set to a certain value by design, for example. Typically, the gate-source potential difference in a verify operation is larger than the gate-source potential difference in the corresponding read operation. For example, a voltage to be applied to a gate of a select memory cell transistor MT in a verify operation is set to be higher than a voltage to be applied to the gate of the select memory cell transistor MT in the corresponding read operation by the amount by which the gate-source potential difference in the verify operation is larger than the gate-source potential difference in the read operation.

In contrast, in the semiconductor storage device 1 according to the first embodiment, a voltage to be applied to a source of a select memory cell transistor MT in a verify operation of first data in the select memory cell transistor MT is set to be lower than a voltage to be applied to the source of the select memory cell transistor MT in a read operation of the first data in the select memory cell transistor MT. In this case, the voltage to be applied to a gate of the select memory cell transistor MT in the verify operation of the first data can be set to a low level, compared to when such setting is not adopted. The widths of the threshold voltage distributions explained with reference to FIG. 4 are maintained even when such control of the voltage to be applied to the source is performed at the time of control of the gate-source potential difference of the select memory cell transistor MT.

For example, when a verify operation is performed, the potentials of word lines, for example, may be stabilized prior to the waiting time for stabilization of the potential of the bit line. That is, the voltage to be applied to a gate of a select memory cell transistor MT and the voltage to be applied to a source of the select memory cell transistor MT are stabilized prior to the waiting time for stabilization of the potential of the bit line. The time taken for the voltage to be applied to a gate of a select memory cell transistor MT to be stabilized is longer than the time taken for the voltage to be applied to a source of the select memory cell transistor MT to be stabilized. Since the voltage to be applied to a gate of a select memory cell transistor MT in a verify operation on the select memory cell transistor MT is decreased in the semiconductor storage device 1 according to the first embodiment, as described above, the time taken for the voltage to be stabilized is shortened. Accordingly, it is possible in the semiconductor storage device 1 according to the first embodiment to shorten the overall waiting time for stabilization of the potential in the verify operation.

Figure 7:
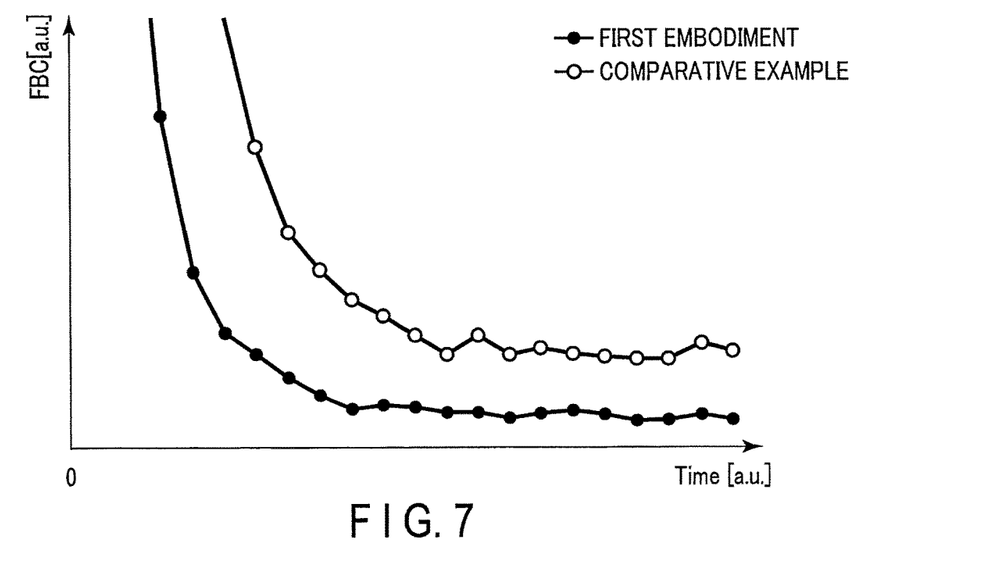
FIG. 7 is a diagram illustrating an example of a graph on which a fail bit count in a verify operation of the semiconductor storage device according to the first embodiment is plotted with respect to the time axis.

FIG. 7 is a diagram illustrating an example of a graph on which a fail bit count in a verify operation of the semiconductor storage device 1, according to the first embodiment, is plotted with respect to the time axis. In the graph shown in FIG. 7, the horizontal axis represents the time from when the verify operation is started, and the vertical axis represents the fail bit count (FBC).

In the semiconductor storage device 1 according to the first embodiment, the waiting time for stabilization of the potential in the verify operation is shortened, as described above. It is thus possible in the semiconductor storage device 1 according to the first embodiment to accurately sense data, as shown in FIG. 7, even if the timing at which the sense amplifier module 12 senses the data is advanced.

In the semiconductor storage device 1 according to the first embodiment, a voltage to be applied to a gate of a select memory cell transistor MT in a verify operation and a voltage to be applied to a gate of the select memory cell transistor MT in a read operation may be set to be equal, for example. Typically, when a voltage is applied to a word line WL, the time taken for the potential to be stabilized may differ between a portion of the word line WL near the row decoder module 13 and a portion of the word line WL far from the row decoder module 13. At this time, when different voltages are applied to the word line WL in a verify operation and a read operation, the near/far behavior of the word line WL also varies. On the other hand, when the voltages to be applied to the word line WL in a verify operation and a read operation are set to be equal, as described above, the near/far behavior of the word line WL in the verify operation and the read operation can be made proximate to each other, thus facilitating the control of the verify operation and the read operation.

[Modifications]

[First Modification]

Figure 8:
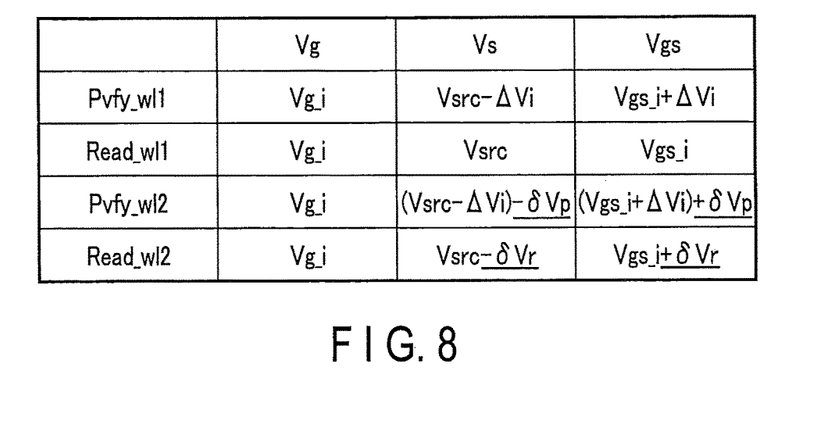
FIG. 8 is a table illustrating an example of voltages used in a verify operation and a read operation in the semiconductor storage device according to a first modification of the first embodiment.

FIG. 8 is a table illustrating an example of voltages used in a verify operation and a read operation in the semiconductor storage device 1 according to a first modification of the first embodiment.

FIG. 8 illustrates an example in which a verify operation and a read operation of data corresponding to one of the states of threshold voltage distributions are performed on each of two memory cell transistors MT coupled to different word lines, for example. Of the two memory cell transistors MT, the memory cell transistor MT coupled to the word line, for example, in the upper layer will be referred to as a "first memory cell transistor MT", and the memory cell transistor MT coupled to the word line, for example, in the lower layer will be referred to as a "second memory cell transistor MT". In the semiconductor storage device 1, word lines WL are, for example, provided at different heights, and arranged along the height direction. For example, of the word lines arranged in this manner, the lower-half word lines are treated as lower-layer word lines, and the upper-half word lines are treated as upper-layer word lines. The setting of voltages that will be explained below may be applied to data corresponding to any state.

In FIG. 8, "Pvfy_wl1" represents a verify operation on the first memory cell transistor MT, and "Read_wl1" represents a read operation on the first memory cell transistor MT. Also, "Pvfy_wl2" represents a verify operation on the second memory cell transistor MT, and "Read_wl2" represents a read operation on the second memory cell transistor MT.

In FIG. 8, to set Vgs to "Vgs_i" in the read operation Read_wl1 on the first memory cell transistor MT, Vg is set to "Vg_i" and Vs is set to "Vsrc". Also, to set Vgs to "Vgs_i+ΔVi" in the verify operation Pvfy_wl1 on the first memory cell transistor MT, Vg is set to "Vg_i" and Vs is set to "Vsrc−ΔVi". Thus, in the verify operation and the read operation on the first memory cell transistor MT, Vgs in the verify operation is set to be larger than Vgs in the read operation by ΔVi, and Vs in the verify operation is set to be lower than Vs in the read operation by an amount corresponding to ΔVi, as explained with reference to FIG. 5B. At this time, Vg in the verify operation is equal to Vg in the read operation.

A program voltage applied to a select memory cell transistor MT in a program operation, for example, may cause program disturbance, namely, an unintentional increase of the threshold voltage of another memory cell transistor MT coupled to the same word line as the select memory cell transistor MT. In the program disturbance, the variation in threshold voltage is smaller in a memory cell transistor MT coupled to a word line in an upper layer, and the variation in threshold voltage is larger in a memory cell transistor MT coupled to a word line in a lower layer, for example. To compensate for such unintended variation in threshold voltage, when a verify operation and/or a read operation of data corresponding to a certain state are performed on a memory cell transistor MT, the potential difference Vgs provided between a gate and a source of the memory cell transistor MT may be varied, according to which layer the word line to which the memory cell transistor MT is coupled is provided in.

In FIG. 8, to set Vgs to "Vgs_i+δVr" in the read operation Read_wl2 on the second memory cell transistor MT, Vg is set to "Vg_i", and Vs is set to "Vsrc−δVr". Also, to set Vgs to "(Vgs_i+ΔVi)+δVp" in the verify operation Pvfy_wl2 on the second memory cell transistor MT, Vg is set to "Vg_i", and Vs is set to "(Vsrc−ΔVi)−δVp".

Thus, in FIG. 8, Vgs in the read operation on the second memory cell transistor MT is set to be higher than Vgs in the read operation on the first memory cell transistor MT by δVr. In FIG. 8, Vs in the read operation on the second memory cell transistor MT is set to be lower than Vs in the read operation on the first memory cell transistor MT by an amount corresponding to δVr. Thereby, a difference can be provided between Vgs in the read operation on the second memory cell transistor MT and Vgs in the read operation on the first memory cell transistor MT. At this time, Vg in the read operation on the second memory cell transistor MT may be set to be equal to Vg in the read operation on the first memory cell transistor MT, as shown in FIG. 8.

Also, in FIG. 8, Vgs in the verify operation on the second memory cell transistor MT is set to be higher than Vgs in the verify operation on the first memory cell transistor MT by δVp. In FIG. 8, Vs in the verify operation on the second memory cell transistor MT is set to be lower than Vs in the verify operation on the first memory cell transistor MT by an amount corresponding to δVp. Thereby, a difference can be provided between Vgs in the verify operation on the second memory cell transistor MT and Vgs in the verify operation on the first memory cell transistor MT. At this time, Vg in the verify operation on the second memory cell transistor MT may be set to be equal to Vg in the verify operation on the first memory cell transistor MT, as shown in FIG. 8.

The control of voltages according to the present embodiment is not limited to the above-described one. For example, by setting Vs in the verify operation on the second memory cell transistor MT to be lower than Vs in the verify operation on the first memory cell transistor MT, Vg in the verify operation on the second memory cell transistor MT can be set to a low level, compared to when such setting is not adopted. Additionally (Alternatively), by setting Vs in the read operation on the second memory cell transistor MT to be lower than Vs in the read operation on the first memory cell transistor MT, Vg in the read operation on the second memory cell transistor MT can be set to a low level, compared to when such setting is not adopted. It is not necessarily required that Vg in the verify operation on the second memory cell transistor MT is set to be equal to Vg in the verify operation on the first memory cell transistor MT, or that Vg in the read operation on the second memory cell transistor MT is set to be equal to Vg in the read operation on the first memory cell transistor MT, as described above.

The explanation has been given above with reference to the setting of voltages used in a verify operation and/or a read operation on a first memory cell transistor MT and a second memory cell transistor MT coupled to word lines in different layers. However, such a setting may be applied to three or more memory cell transistors MT, between any two of which the above-described variation in threshold voltage may occur. Moreover, such a setting may be applied to a plurality of memory cell transistors MT having threshold voltages that vary for a reason other than the above-described.

[Second Modification]

Figure 9:
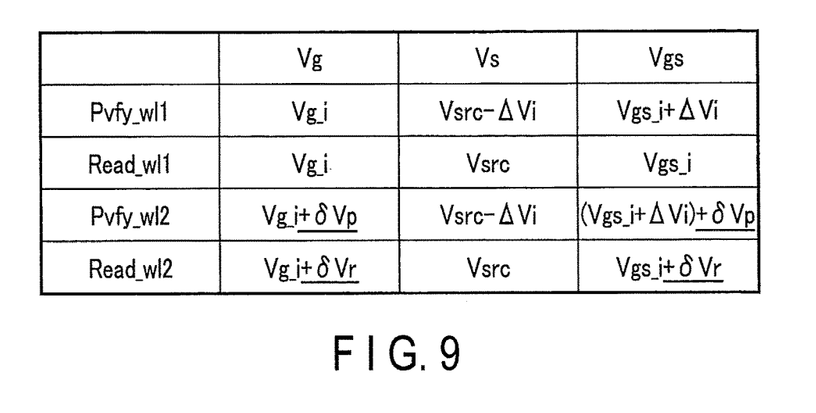
FIG. 9 is a table illustrating an example of voltages used in a verify operation and a read operation in the semiconductor storage device according to a second modification of the first embodiment.

FIG. 9 is a table illustrating an example of voltages used in a verify operation and a read operation in the semiconductor storage device 1 according to a second modification of the first embodiment. FIG. 9 illustrates another example in which a verify operation and a read operation of data corresponding to one of the states of threshold voltage distributions are performed on the first memory cell transistor MT and the second memory cell transistor MT, as in FIG. 8.

As shown in FIG. 9, voltages used in a verify operation and a read operation on the first memory cell transistor MT are the same as those shown in FIG. 8.

In FIG. 9, to set Vgs to "Vgs_i+δVr" in the read operation Read_wl2 on the second memory cell transistor MT, Vg is set to "Vg_i+δVr" and Vs is set to "Vsrc". Also, to set Vgs to "(Vgs_i+ΔVi)+δVp" in the verify operation Pvfy_wl2 on the second memory cell transistor MT, Vg is set to "Vgi+δVp", and Vs is set to "Vsrc−ΔVi".

Thus, in FIG. 9, Vg in the read operation on the second memory cell transistor MT is set to be higher than Vg in the read operation on the first memory cell transistor MT by an amount corresponding to δVr. Thereby, a difference can be provided between Vgs in the read operation on the second memory cell transistor MT and Vgs in the read operation on the first memory cell transistor MT. Also, Vg in the verify operation on the second memory cell transistor MT is set to be higher than Vg in the verify operation on the first memory cell transistor MT by an amount corresponding to δVp. Thereby, a difference can be provided between Vgs in the verify operation on the second memory cell transistor MT and Vgs in the verify operation on the first memory cell transistor MT.

[Third Modification]

Figure 10:
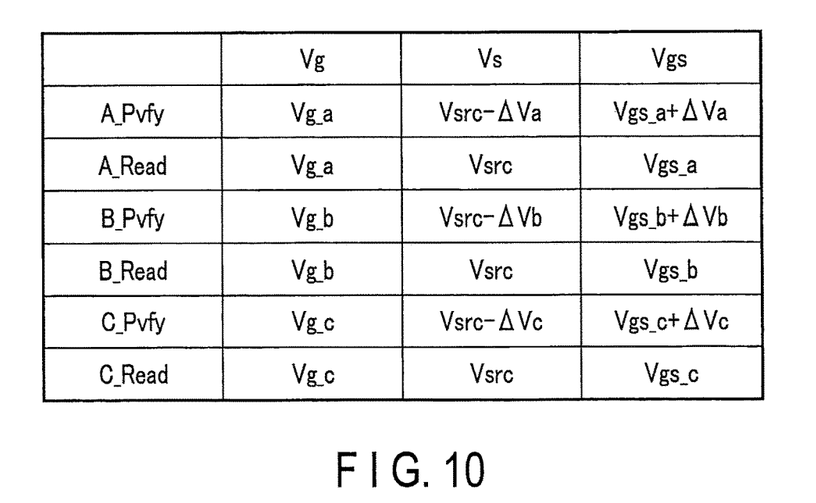
FIG. 10 is a table illustrating an example of voltages used in a verify operation and a read operation in the semiconductor storage device according to a third modification of the first embodiment.

FIG. 10 is a table illustrating an example of voltages used in a verify operation and a read operation in the semiconductor storage device 1 according to a third modification of the first embodiment.

FIG. 10 illustrates an example in which a verify operation and a read operation of data corresponding to each of three states of threshold voltage distributions are performed on a select memory cell transistor MT. Even though A state, B state, and C state are illustrated as the three states, similar setting can be applied to a combination of data corresponding to any other states, as well as a combination of data corresponding to four or more states.

In FIG. 10, "A_Pvfy" represents a verify operation of data corresponding to A state, and "A_Read" represents a read operation of data corresponding to A state. Moreover, "B_Pvfy" represents a verify operation of data corresponding to B state, and "B_Read" represents a read operation of data corresponding to B state. Furthermore, "C_Pvfy" represents a verify operation of data corresponding to C state, and "C_Read" represents a read operation of data corresponding to C state.

In FIG. 10, to set Vgs to "Vgs_a" in the read operation A_Read of the data corresponding to A state, Vg is set to "Vg_a", and Vs is set to "Vsrc". Also, to set Vgs to "Vgs_a+$\Delta$Va" in the verify operation A_Pvfy of the data corresponding to A state, Vg is set to "Vg_a", and Vs is set to "Vsrc−$\Delta$Va". Moreover, to set Vgs to "Vgs_b" in the read operation B_Read of the data corresponding to B state, Vg is set to "Vg_b", and Vs is set to "Vsrc". Also, to set Vgs to "Vgs_b+$\Delta$Vb" in the verify operation B_Pvfy of the data corresponding to B state, Vg is set to "Vg_b", and Vs is set to "Vsrc−$\Delta$Vb". Furthermore, to set Vgs to "Vgs_c" in the read operation C_Read of the data corresponding to C state, Vg is set to "Vg_c", and Vs is set to "Vsrc". Also, to set Vgs to "Vgs_c+$\Delta$Vc" in the verify operation C_Pvfy of the data corresponding to C state, Vg is set to "Vg_c", and Vs is set to "Vsrc−$\Delta$Vc".

Thus, in the verify operation and the read operation of the data corresponding to A state, Vgs in the verify operation is set to be higher than Vgs in the read operation by $\Delta$Va, and Vs in the verify operation is set to be lower than Vs in the read operation by an amount corresponding to $\Delta$Va, as explained with reference to FIG. 5B. Similarly, in the verify operation and the read operation of the data corresponding to B state, Vgs in the verify operation is set to be higher than Vgs in the read operation by $\Delta$Vb, and Vs in the verify operation is set to be lower than Vs in the read operation by an amount corresponding to $\Delta$Vb. Furthermore, in the verify operation and the read operation of the data corresponding to C state, Vgs in the verify operation is set to be higher than Vgs in the read operation by $\Delta$Vc, and Vs in the verify operation is set to be lower than Vs in the read operation by an amount corresponding to $\Delta$Vc. At this time, Vg in the verify operation of data corresponding to each of A state, B state, and C state is equal to Vg in the read operation of the data.

Here, $\Delta$Va, $\Delta$Vb, and $\Delta$Vc may be of any magnitude. At this time, in the example of FIG. 10, Vs in the verify operation of the data corresponding to A state, Vs in the verify operation of the data corresponding to B state, and Vs in the verify operation of the data corresponding to C state are not necessarily equal, while Vs in the read operation of the data corresponding to A state, Vs in the read operation of the data corresponding to B state, and Vs in the read operation of the data corresponding to C state are equal.

[Fourth Modification]

Figure 11:
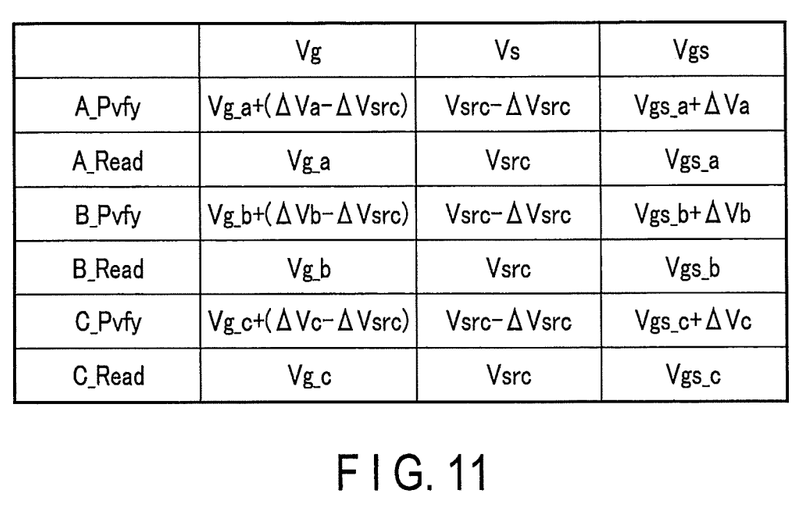
FIG. 11 is a table illustrating an example of voltages used in a verify operation and a read operation in the semiconductor storage device according to a fourth modification of the first embodiment.

FIG. 11 is a table illustrating an example of voltages used in a verify operation and a read operation in the semiconductor storage device 1 according to a fourth modification of the first embodiment. FIG. 11 illustrates another example in which a verify operation and a read operation of data corresponding to each of three states of threshold voltage distributions are performed on a select memory cell transistor MT, as in FIG. 10. Even though A state, B state, and C state are illustrated as the three states, similar setting can be applied to a combination of data corresponding to any other states, as well as a combination of data corresponding to four or more states.

As shown in FIG. 11, voltages used in read operations (A_Read, B_Read, and C_Read) of data corresponding to A state, B state, and C state are the same as those shown in FIG. 10.

In FIG. 11, to set Vgs to "Vgs_a+$\Delta$Va" in the verify operation A_Pvfy of the data corresponding to A state, Vg is set to "Vg_a+($\Delta$Va−$\Delta$Vsrc)", and Vs is set to "Vsrc−$\Delta$Vsrc". Moreover, to set Vgs to "Vgs_b+$\Delta$Vb" in the verify operation B_Pvfy of the data corresponding to B state, Vg is set to "Vg_b+($\Delta$Vb−$\Delta$Vsrc)", and Vs is set to "Vsrc−$\Delta$Vsrc". Furthermore, to set Vgs to "Vgs_c+$\Delta$Vc" in the verify operation C_Pvfy of the data corresponding to C state, Vg is set to "Vg_c+($\Delta$Vc−$\Delta$Vsrc)", and Vs is set to "Vsrc−$\Delta$Vsrc".

For example, $\Delta$Vsrc is equal to the smallest among $\Delta$Va, $\Delta$Vb, and $\Delta$Vc. As an example, $\Delta$Va<$\Delta$Vb<$\Delta$Vc. In FIG. 11, Vgs in the verify operation of the data corresponding to A state is higher than Vgs in the read operation of the data by $\Delta$Va, Vgs in the verify operation of the data corresponding to B state is higher than Vgs in the read operation of the data by $\Delta$Vb, and Vgs in the verify operation of the data corresponding to C state is higher than Vgs in the read operation of the data by $\Delta$Vc. In a verify operation and a read operation of data corresponding to each of A state, B state, and C state, Vs in the verify operation is set to be lower than Vs in the read operation by an amount corresponding to $\Delta$Vsrc, which is equal to the smallest among $\Delta$Va, $\Delta$Vb, and $\Delta$Vc. Also, in a verify operation and a read operation of data corresponding to each of A state, B state, and C state, Vg in the verify operation is set to be higher than Vg in the read operation by a difference obtained by subtracting $\Delta$Vsrc from the difference between Vgs in the verify operation and Vgs in the read operation.

At this time, in the example of FIG. 11, Vs in the read operation of the data corresponding to A state, Vs in the read operation of the data corresponding to B state, and Vs in the read operation of the data corresponding to C state are equal, and Vs in the verify operation of the data corresponding to A state, Vs in the verify operation of the data corresponding to B state, and Vs in the verify operation of the data corresponding to C state are also equal.

A case has been explained above where $\Delta$Vsrc is equal to the smallest among $\Delta$Va, $\Delta$Vb, and $\Delta$Vc. However, $\Delta$Vsrc may be of any magnitude.

Other Embodiments

With regard to the terms "same", "equal", and "identical" used to denote the magnitudes of voltages in the above-described first embodiment, it should be appreciated that, when one voltage is described as being the same as, equal to, or identical to another voltage, an error within the range of design may be tolerated between the magnitudes of the two voltages being compared.

In the specification of the present application, "couple" refers to electrical coupling, and does not exclude intervention of another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device, comprising:
a first memory cell configured to store first data; and
a control circuit configured to apply a first voltage to a source of the first memory cell in a read operation of the first data in the first memory cell, and to apply a second voltage to the source of the first memory cell in a verify operation of the first data in the first memory cell, the second voltage being lower than the first voltage, wherein
the first memory cell is configured to store second data different from the first data,
the control circuit is configured to apply a third voltage to the source of the first memory cell in a read operation of the second data in the first memory cell, and to apply a fourth voltage to the source of the first memory cell in a verify operation of the second data in the first memory cell, the fourth voltage being lower than the third voltage, and
a difference between a magnitude of the first voltage and a magnitude of the second voltage and a difference between a magnitude of the third voltage and a magnitude of the fourth voltage are different.

2. The device of claim 1, wherein
the control circuit is configured to apply a fifth voltage to a gate of the first memory cell in the read operation of the first data, and to apply a sixth voltage to the gate of the first memory cell in the verify operation of the first data, the sixth voltage being of a magnitude identical to a magnitude of the fifth voltage.

3. The device of claim 1, further comprising:
a second memory cell configured to store the first data, wherein
the control circuit is configured to apply a seventh voltage to a source of the second memory cell in a read operation of the first data in the second memory cell, the seventh voltage being of a magnitude different from the magnitude of the first voltage.

4. The device of claim 3, wherein
the control circuit is configured to apply a fifth voltage to a gate of the first memory cell in the read operation of the first data in the first memory cell, and to apply an eighth voltage to a gate of the second memory cell in the read operation of the first data in the second memory cell, the eighth voltage being of a magnitude identical to a magnitude of the fifth voltage.

5. The device of claim 3, wherein
the first memory cell is coupled to a first word line, and the second memory cell is coupled to a second word line different from the first word line.

6. The device of claim 1, further comprising:
a second memory cell configured to store the first data, wherein
the control circuit is configured to apply a ninth voltage to a source of the second memory cell in a verify operation of the first data in the second memory cell, the ninth voltage being of a magnitude different from the magnitude of the second voltage.

7. The device of claim 6, wherein
the control circuit is configured to apply a sixth voltage to a gate of the first memory cell in the verify operation of the first data in the first memory cell, and to apply a tenth voltage to a gate of the second memory cell in the verify operation of the first data in the second memory cell, the tenth voltage being of a magnitude identical to a magnitude of the sixth voltage.

8. The device of claim 6, wherein
the first memory cell is coupled to a first word line, and the second memory cell is coupled to a second word line different from the first word line.

9. The device of claim 1, further comprising:
a second memory cell configured to store the first data, wherein
the control circuit is configured to apply a fifth voltage to a gate of the first memory cell in the read operation of the first data in the first memory cell, and to apply an eighth voltage to a gate of the second memory cell in a read operation of the first data in the second memory cell, the eighth voltage being of a magnitude different from a magnitude of the fifth voltage.

10. The device of claim 9, wherein
the control circuit is configured to apply a seventh voltage to a source of the second memory cell in the read operation of the first data in the second memory cell, the seventh voltage being of a magnitude identical to the magnitude of the first voltage.

11. The device of claim 9, wherein
the first memory cell is coupled to a first word line, and the second memory cell is coupled to a second word line different from the first word line.

12. The device of claim 1, further comprising:
a second memory cell configured to store the first data, wherein
the control circuit is configured to apply a voltage to a gate of the first memory cell in the verify operation of the first data in the first memory cell, and to apply a tenth voltage to a gate of the second memory cell in a verify operation of the first data in the second memory cell, the tenth voltage being of a magnitude different from a magnitude of the sixth voltage.

13. The device of claim 12, wherein
the control circuit is configured to apply a ninth voltage to a source of the second memory cell in the verify operation of the first data in the second memory cell, the ninth voltage being of a magnitude identical to the magnitude of the second voltage.

14. The device of claim 12, wherein
the first memory cell is coupled to a first word line, and the second memory cell is coupled to a second word line different from the first word line.

15. The device of claim 1, wherein
the magnitude of the third voltage is identical to the magnitude of the first voltage.

16. The device of claim 1, wherein
the control circuit is configured to:
apply a fifth voltage to a gate of the first memory cell in the read operation of the first data in the first memory cell, and apply a sixth voltage to the gate of the first memory cell in the verify operation of the first data in the first memory cell, the sixth voltage being of a magnitude identical to a magnitude of the fifth voltage, and
apply an eleventh voltage to the gate of the first memory cell in the read operation of the second data in the first memory cell, and apply a twelfth voltage to the gate of the first memory cell in the verify operation of the second data in the first memory cell, the twelfth voltage being of a magnitude identical to a magnitude of the eleventh voltage.

17. A semiconductor storage device, comprising:
a first memory cell configured to store first data; and
a control circuit configured to apply a first voltage to a source of the first memory cell in a read operation of the first data in the first memory cell, and to apply a second voltage to the source of the first memory cell in a verify operation of the first data in the first memory cell, the second voltage being lower than the first voltage, wherein
the first memory cell is configured to store second data different from the first data,
the control circuit is configured to:
apply a third voltage to the source of the first memory cell in a read operation of the second data in the first memory cell, and apply a fourth voltage to the source of the first memory cell in a verify operation of the second data in the first memory cell, the fourth voltage being lower than the third voltage,
apply a fifth voltage to a gate of the first memory cell in the read operation of the first data in the first memory cell, and apply a sixth voltage to the gate of the first memory cell in the verify operation of the first data in the first memory cell, and apply an eleventh voltage to the gate of the first memory cell in the read operation of the second data in the first memory cell, and apply a twelfth voltage to the gate of the first memory cell in the verify operation of the second data in the first memory cell, and a difference between a magnitude of the fifth voltage and a magnitude of the sixth voltage and a difference between a magnitude of the eleventh voltage and a magnitude of the twelfth voltage are different.

18. The device of claim 17, wherein
a magnitude of the third voltage is identical to a magnitude of the first voltage, and
a magnitude of the fourth voltage is identical to a magnitude of the second voltage.

* * * * *